(12) United States Patent
Kim et al.

(10) Patent No.: US 6,333,249 B2
(45) Date of Patent: Dec. 25, 2001

(54) METHOD FOR FABRICATING A SEMICONDUCTOR DEVICE

(75) Inventors: Seon Soon Kim; Jun Gi Choi, both of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/751,941

(22) Filed: Jan. 2, 2001

(30) Foreign Application Priority Data

Dec. 31, 1999 (KR) .................................................. 99-67972

(51) Int. Cl.⁷ ................................................. H01L 21/3205
(52) U.S. Cl. ........................... 438/592; 438/231; 438/299
(58) Field of Search .................................... 438/199, 229, 438/230, 271, 232, 299, 303, 305, 306, 592, 593

(56) References Cited

U.S. PATENT DOCUMENTS

| | | | |
|---|---|---|---|
| 4,912,061 | * 3/1990 | Nasr | 438/231 |
| 5,168,072 | * 12/1992 | Moslehi | 438/300 |
| 5,397,909 | * 3/1995 | Moslehi | 257/383 |
| 6,093,628 | * 7/2000 | Lim et al. | 438/592 |
| 6,177,336 | * 1/2001 | Lin et al. | 438/592 |
| 6,194,299 | * 2/2001 | Buynoski | 438/592 |
| 6,211,026 | * 4/2001 | Ahmad et al. | 438/300 |

* cited by examiner

Primary Examiner—John F. Niebling
Assistant Examiner—Christopher Lattin
(74) Attorney, Agent, or Firm—Pillsbury Winthrop LLP (57) ABSTRACT

A method for fabricating a semiconductor device is disclosed. In a process for fabricating a CMOS transistor of a high integrated semiconductor device and a cell of a DRAM, a process for forming a dual gate electrode having a layered structure of a tungsten layer and a polysilicon layer includes the steps of forming a gate electrode shape from an undoped polysilicon layer, forming an insulating film spacer at sidewalls of the polysilicon layer, forming an LDD region, removing a portion of the undoped polysilicon layer to leave a predetermined thickness and to form an opening in which the tungsten layer will be formed, and respectively implanting different impurity ions into the undoped polysilicon layer respectively formed in the PMOS region and the NMOS region before forming the tungsten layer. Thus, it is possible to prevent etching residue from occurring and also prevent the semiconductor substrate from being damaged. In addition, it is possible to prevent the tungsten layer from being oxidized due to a high temperature process such as an ion plantation process for forming the LDD region and the source/drain region, thereby improving operational characteristics of the device and process yield.

6 Claims, 7 Drawing Sheets

METHOD FOR FABRICATING A SEMICONDUCTOR DEVICE

BACKGROUND OF THE INVENTION

1. Field of the Invention

The present invention relates to a method for fabricating a semiconductor device, and more particularly, to a method for forming a gate electrode by a semi-damascene process to prevent a metal layer from being oxidized when a gate electrode having a layered structure of the metal layer and a polysilicon layer is formed in a CMOS transistor of a high integrated device such as a DRAM cell.

2. Background of the Related Art

In a prior art method for fabricating a dual gate electrode device, a $n^+$ gate and a $p^+$ gate are respectively deposited and patterned on an upper portion of an undoped polysilicon layer using a mask and dual implantation method ($n^+$:As,P, $p^+$:B,BF$_2$), or an in-situ doping method.

The dual implantation method has a relatively simple process, but it is difficult to achieve high doping levels. Also, in the dual implantation method, it is likely that gate depletion will occur as a result of the dopant profile characteristics.

In the in-situ doping method it is necessary to set up respective process steps, because the gate electrodes for the $n^+$ and $p^+$ polysilicon layers should be formed separately.

A prior art method for fabricating a semiconductor device will be described with reference to the accompanying drawings.

Figure 1A:
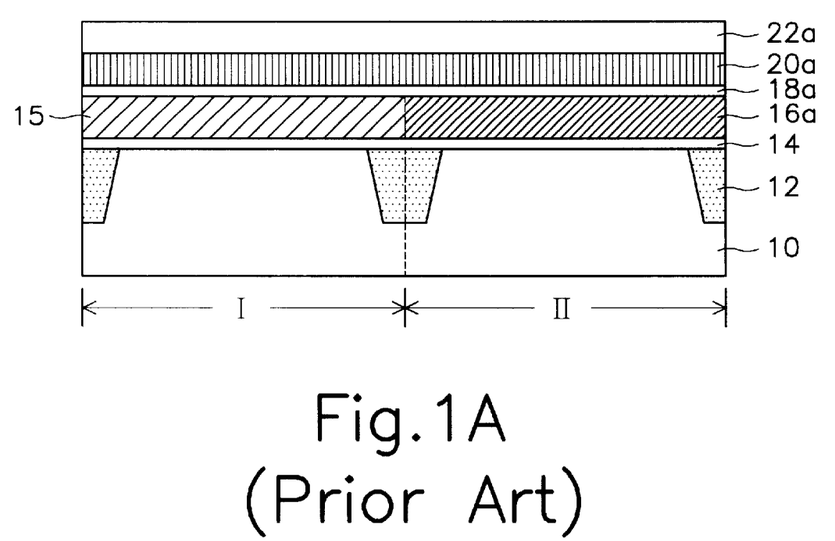
FIGS. 1A to 1C are sectional views illustrating related art process steps of fabricating a semiconductor device.
Figure 1B:
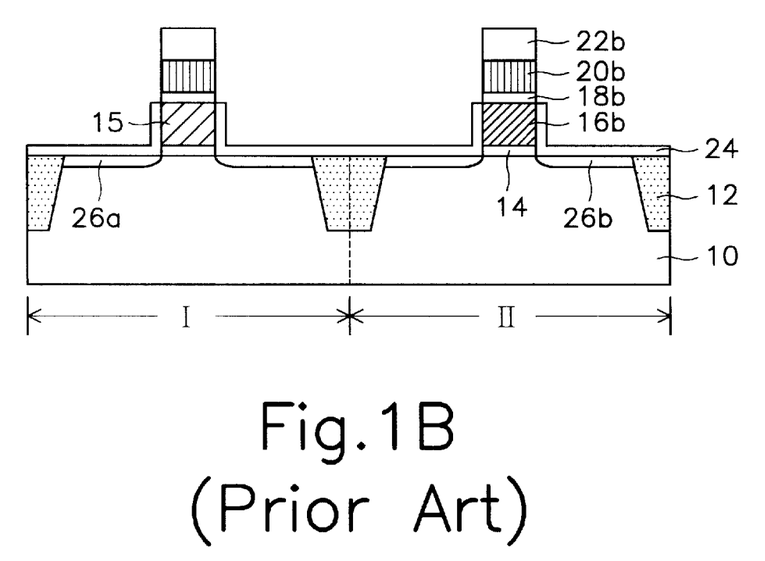
Figure 1C:
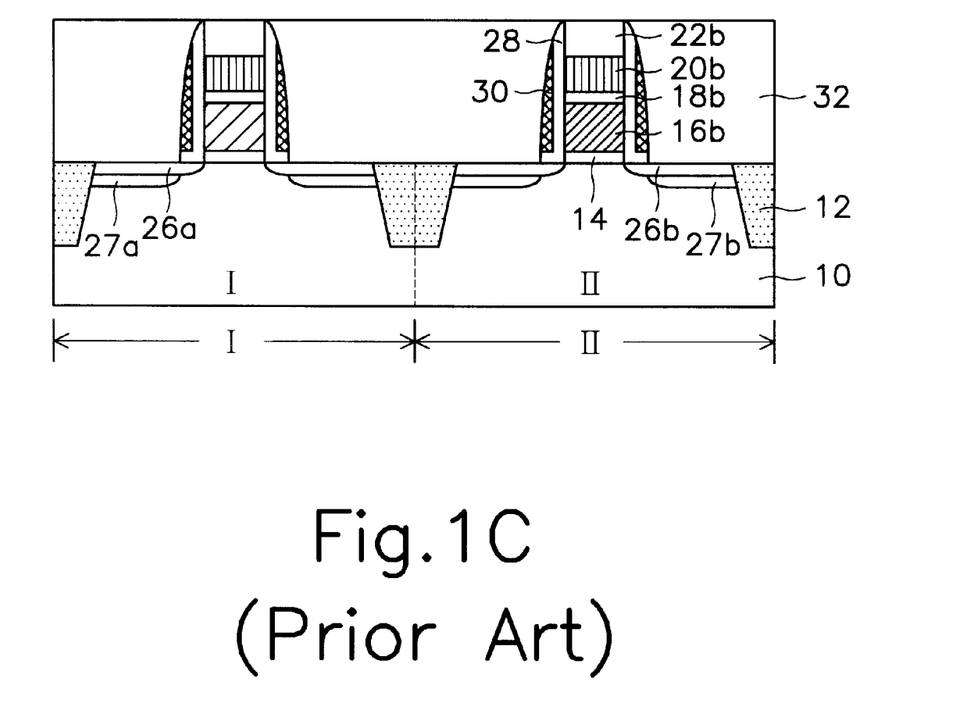

FIGS. 1A to 1C are sectional views showing prior art process steps for fabricating a semiconductor device.

As shown in FIG. 1A, a device isolation film 12 is formed to define active regions on a semiconductor substrate 10.

A p-type well is formed in a portion where an NMOS device will be formed (NMOS region I), and an n-type well is formed in a portion where a PMOS device will be formed (region II).

Subsequently, a gate insulating film 14 is formed on the upper portion of the entire surface, and a polysilicon layer is formed on the gate insulating film 14. A first photoresist film pattern is then formed on the polysilicon layer to expose the NMOS region I. An $n^+$ polysilicon layer is formed by an n-type impurity ion implantation using the first photoresist film pattern as an ion implantation mask.

Afterwards, the first photoresist film pattern is removed. A second photoresist film pattern is then formed on the polysilicon layer to expose the PMOS region II. A $p^+$ polysilicon layer 16a is formed by a p-type impurity ion implantation using the second photoresist film pattern as an ion implantation mask. Then, the second photoresist film pattern is removed.

Next, a diffusion prevention film 18a, a metal layer 20a, and a mask insulating film 22a are sequentially formed on the upper portion of the entire surface to form a layered structure.

As shown in FIG. 1B, the layered structure and the polysilicon layer into which the impurity ions were implanted are etched using a gate electrode mask that which protects a portion where a gate electrode will be formed as an etching mask. Thus, a mask insulating pattern 22b, a metal layer pattern 20b, a diffusion prevention film pattern 18b, an $n^+$ gate electrode 15b, and a $p^+$ gate electrode 16b are formed.

Afterwards, the $n^+$ gate electrode 15b, the $p^+$ gate electrode 16b, and the exposed semiconductor substrate 10 are selectively oxidized to form a buffer insulating film 24.

Subsequently, a mask process is respectively performed in the NMOS region I and the PMOS region II, so that a lightly doped impurity ion implants can be made into the NMOS region I and the PMOS region II. Thus, an n-LDD region 26a and a p-LDD region 26b are formed.

As shown in FIG. 1C, a double structure of an oxide film spacer 28 and a nitride film spacer 30 is formed at the sidewalls of the mask insulating film pattern 22b, the metal layer pattern 20b, the diffusion prevention film pattern 18b, and the $n^+$ gate electrode 15b the $p^+$ gate electrode 16b respectively.

Subsequently, a mask process is respectively performed in the NMOS region I and the PMOS region II, so that a heavily doped impurity ion is implanted into the NMOS region I and the PMOS region II. Thus, an $n^+$ source/drain region 27a and a $p^+$ source/drain region 27b are formed. The nitride film spacer 30 will act as an etching barrier in a later self-aligned contact process.

Afterwards, an interlayer insulating film 32 is formed on the upper portion of the entire surface and then planarized.

The aforementioned related art method for fabricating a semiconductor device has several problems.

The metal layer pattern constituting the gate electrode expands during later annealing processes. The metal layer pattern also expands due to etching selectivity differences between the mask insulating film and the metal layer pattern during etching process for forming the gate electrode. For this reason, the impurity ion is not implanted into a corner portion of the gate electrode during the subsequent ion implantation process for forming the LDD regions. Furthermore, lifting of the gate electrode can occur due to oxidation of the metal layer pattern. This deteriorates the device characteristics, yield and reliability.

SUMMARY OF THE INVENTION

Accordingly, the present invention is directed to a method for fabricating a semiconductor device that substantially overcomes one or more of the problems limitations and disadvantages of the prior.

An object of the present invention is to provide a method for fabricating a semiconductor device which prevents a metal layer from being oxidized during subsequent high temperature processes such as an ion implantation process, by forming a conductive layer pattern of polysilicon or amorphous silicon in a gate electrode shape, forming an insulating film spacer at the sidewalls of the conductive layer pattern, forming an LDD region by a lightly doped impurity ion implantation, removing a predetermined thickness of the conductive layer pattern to form a metal layer pattern, and then forming a gate electrode.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve these and other advantages and in accordance with the purpose of the present invention, as embodied and broadly described, a method for fabricating a semiconductor device according to the present invention includes the steps of: forming a gate insulating film on a semiconductor substrate provided with a cell region and a peripheral circuit region where NMOS and PMOS regions will be formed; forming an undoped polysilicon layer pattern having a gate electrode shape on the gate insulating film; forming an oxide film having a predetermined thickness on an upper portion of the entire surface; respectively forming an LDD region in the semiconductor substrate at both sides of the undoped polysilicon layer pattern of both in PMOS region in the peripheral circuit region and the NMOS regions in the cell region and the peripheral circuit region; forming a nitride film having a predetermined thickness on the upper portion of the entire surface; etching the nitride film and the oxide film without patterning to form a spacer having a double structure of a nitride film and an oxide film at sidewalls of the undoped polysilicon layer pattern; respectively implanting a heavily doped impurity ion into both spacers of the NMOS region and the PMOS region in the peripheral circuit region to form a source/drain region; forming an interlayer insulating film on the upper portion of the entire surface and then planarizing the interlayer insulating film to expose the undoped polysilicon layer pattern; removing a portion of the exposed undoped polysilicon layer pattern by the entire etching process to leave a predetermined thickness and form a groove; respectively implanting impurity ions into the undoped polysilicon layer pattern of the NMOS and PMOS regions in the cell region and the peripheral circuit region, to form a gate electrode of doped polysilicon; forming a diffusion prevention film and a metal layer having a predetermined depth in an upper portion of the groove; and forming a mask insulating film pattern buried in the upper portion of the exposed groove.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to the preferred embodiments of the present invention, examples of which are illustrated in the accompanying drawings.

Figure 2A:
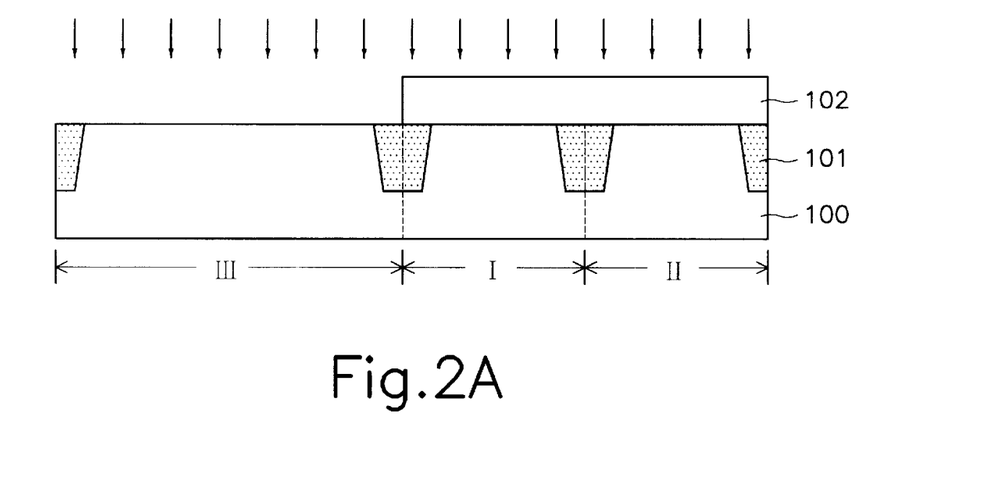
FIGS. 2A to 2I are sectional views illustrating process steps of fabricating a semiconductor device according to the present invention.

As shown in FIG. 2A, a device isolation insulating film 101 is formed to define an active region of a semiconductor substrate 100.

A first photoresist film pattern 102 is formed on upper portion of an entire surface to expose a portion where an NMOS region III of a cell region will be formed in the semiconductor substrate 100. A p-type impurity ion is implanted into the semiconductor substrate 100 using the first photoresist film pattern 102 as an ion implantation mask to form a p-type well.

The above process steps are repeated, so that a p-type well and an n-type well are formed in an NMOS region I and a PMOS region II in a peripheral circuit region of the semiconductor substrate 100.

Figure 2B:
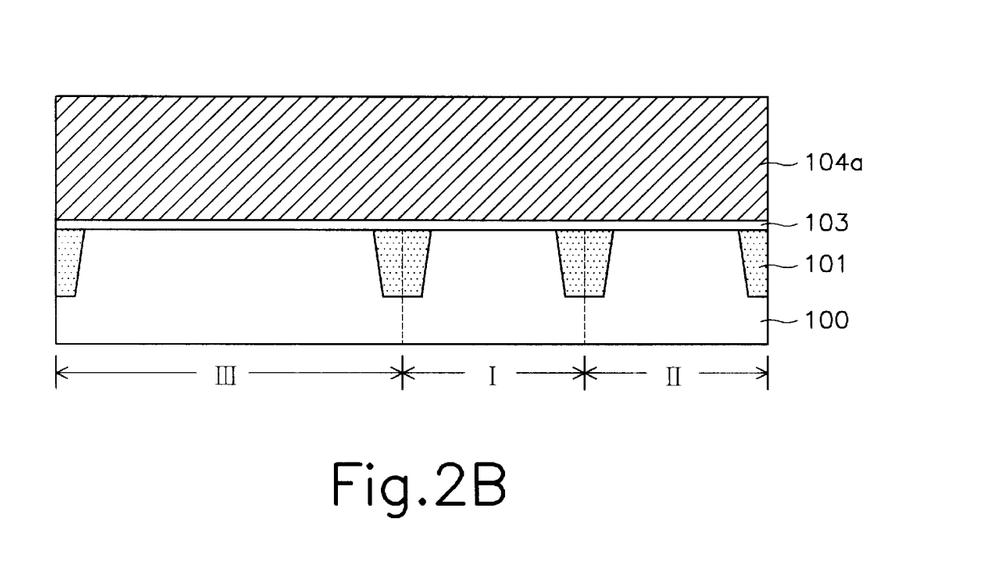

As shown in FIG. 2B, the first photoresist film pattern 102 is removed and a layered structure of a gate insulating film 103 and an undoped polysilicon layer 104a is formed on the upper portion of the entire surface. At this time, the undoped polysilicon layer 104a has the same thickness as that the stacked conductive layer, metal layer and mask insulating film that will be formed later. The conductive layer, the metal layer and the mask insulating film later will be used to form the gate electrode.

Figure 2C:
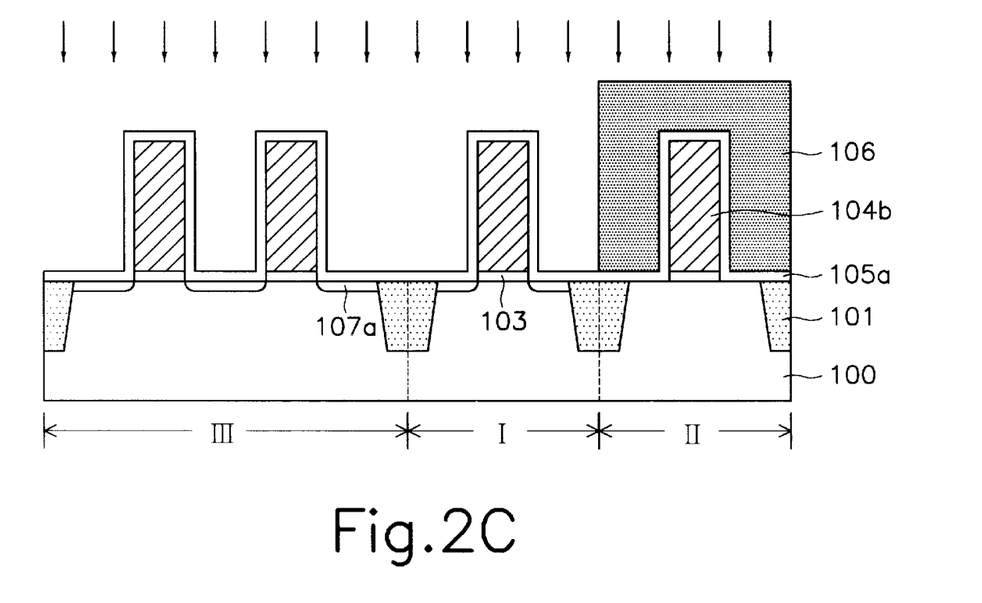

As shown in FIG. 2C, the undoped polysilicon layer 104a is etched using a gate electrode mask, which protects a portion where a gate electrode will be formed, as an etching mask, to form an undoped polysilicon layer pattern 104b.

Then, an oxide film 105a having a predetermined thickness is formed on the upper portion of the entire surface by a thermal oxidation process both to compensate for the semiconductor substrate 100 damaged during the etching process and to prevent the semiconductor substrate 100 and the undoped polysilicon layer pattern 104b from being damaged during the subsequent formation of a nitride film.

Subsequently, a second photoresist film pattern 106 is formed on the oxide film 105a to protect the PMOS region II. An n-LDD region 107a is formed by implanting an n type lightly doped impurity ion using the second photoresist film pattern 106 as an ion implantation mask.

Figure 2D:
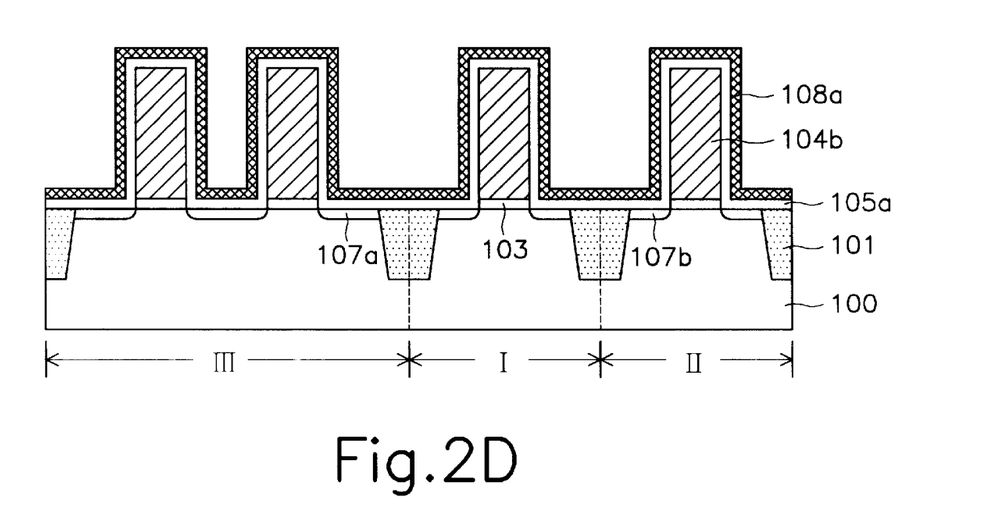

As shown in FIG. 2D, the second photoresist film pattern 106 is removed, and a p-LDD region 107b is formed in the PMOS region II in the same manner as above. A nitride film 108a is then formed on the upper portion of the entire surface to a predetermined thickness.

Figure 2E:
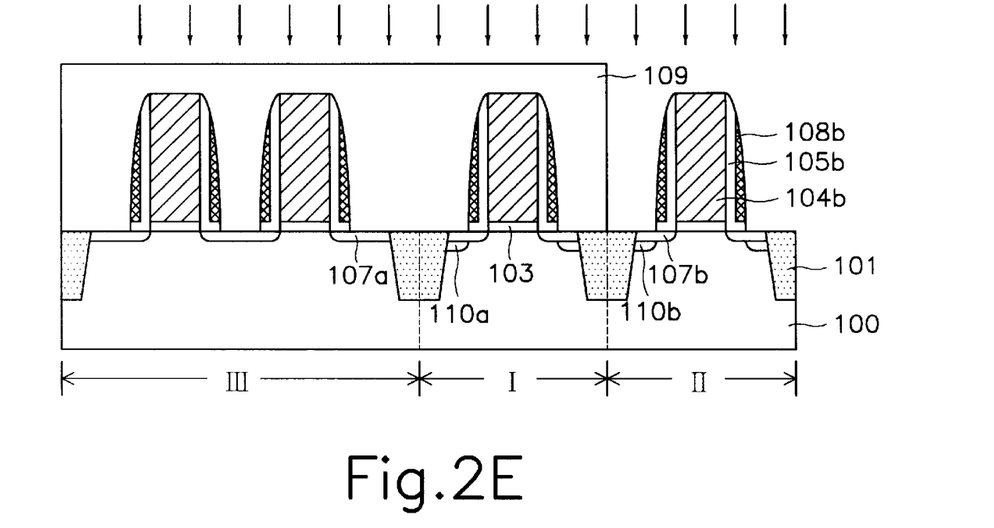

As shown in FIG. 2E, the nitride film 108a and the oxide film 105a are etched to form a layered structure of a nitride film spacer 108b and an oxide film spacer 105b at the sidewalls of the undoped polysilicon layer pattern 104b.

Subsequently, a third photoresist film pattern 109 is formed on the upper portion of the entire surface to expose the PMOS region II of the peripheral circuit region.

Afterwards, a heavily doped p$^+$ source/drain region 110b is formed by implanting a high dose of a p-type doped impurity ion into the semiconductor substrate 100 at both sides of the layered structure using the third photoresist film pattern 109 as an ion implantation mask.

The third photoresist film pattern 109 is then removed, and a heavily doped n$^+$ source/drain region 110a is formed by implanting a high dose of an n-type impurity ion into the NMOS region I of the peripheral circuit region in the same manner as above.

Figure 2F:
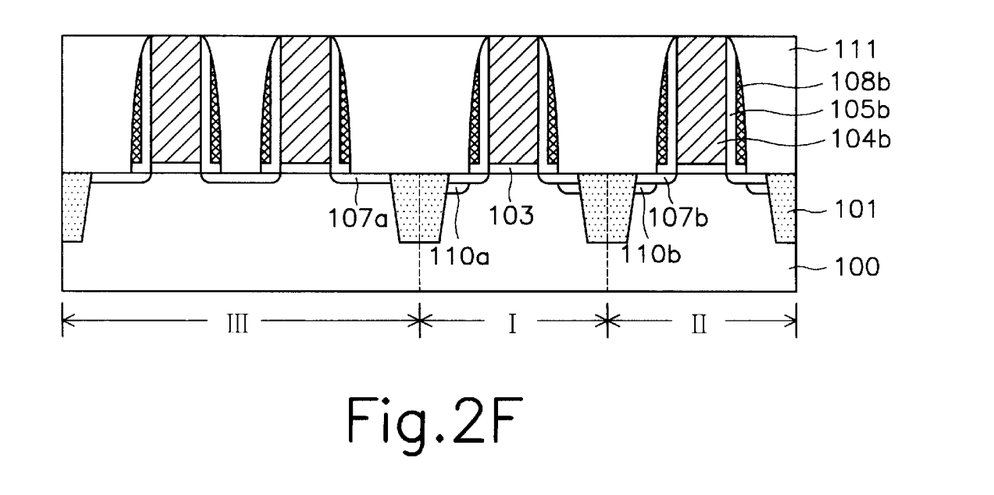

As shown in FIG. 2F, an interlayer insulating film 111 is formed on the upper portion of the entire surface and is then removed by a chemical mechanical polishing (CMP) process to expose the uppermost portion of the undoped polysilicon layer pattern 104b. The interlayer insulating film 111 may comprise an oxide film or a nitride film.

Figure 2G:
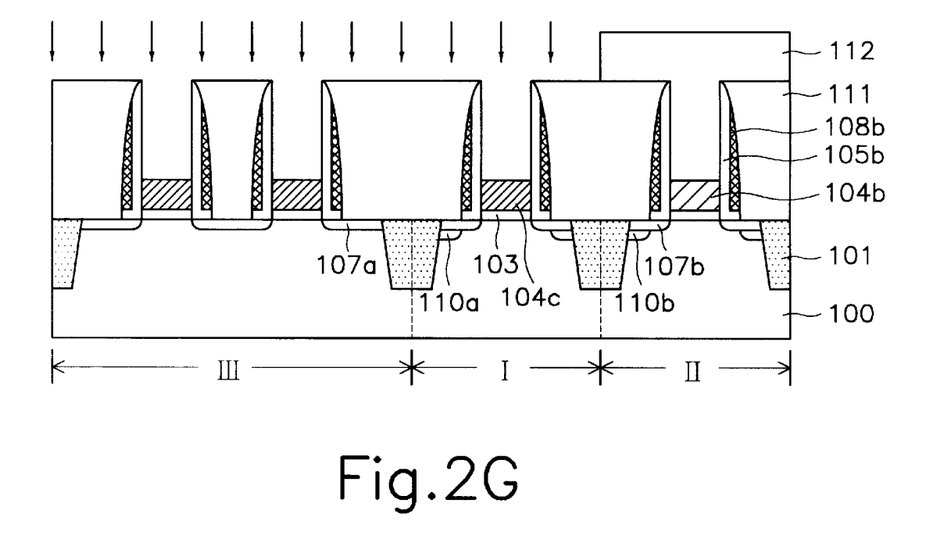

As shown in FIG. 2G, a portion of the undoped polysilicon layer pattern 104b is removed by selective etching process, leaving a desired thickness of the polysilicon, forming a groove between the oxide film spacers 105b and exposing a portion where the gate electrode will be formed.

A fourth photoresist film pattern 112 is formed on the upper portion of the entire surface to protect the PMOS region II.

Next, an n$^+$ polysilicon layer pattern 104c is formed by implanting an n-type impurity ion into the exposed undoped polysilicon layer pattern 104b using the fourth photoresist film pattern 112 as an ion implantation mask.

Figure 2H:
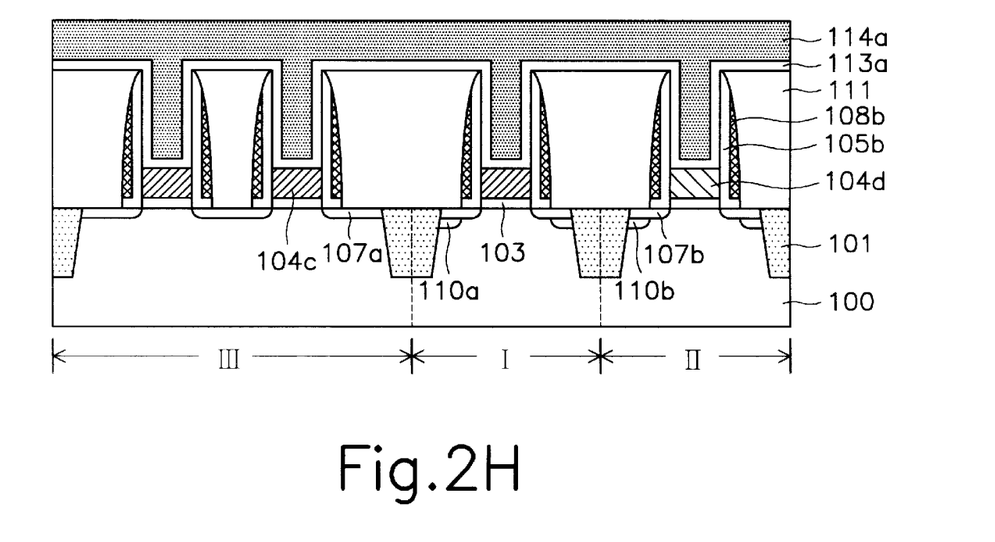

As shown in FIG. 2H, the fourth photoresist film pattern 112 is removed, and a p$^+$ polysilicon layer pattern 104d is formed by implanting a p-type impurity ion into the undoped polysilicon layer pattern 104b of the PMOS region II in the same manner as above.

Subsequently, a diffusion prevention film 113a is formed on the upper portion of the entire surface at a predetermined thickness, and a metal layer 114a is formed on the diffusion prevention film 113a to completely fill the groove. It is preferred that, the diffusion prevention film 113a is formed of WN having a thickness 50 A~150 A to prevent the metal layer 114a from being oxidized. The metal layer 114a is preferably formed from tungsten layer, TiSi$_x$ or WSi$_x$ layer.

Figure 2I:
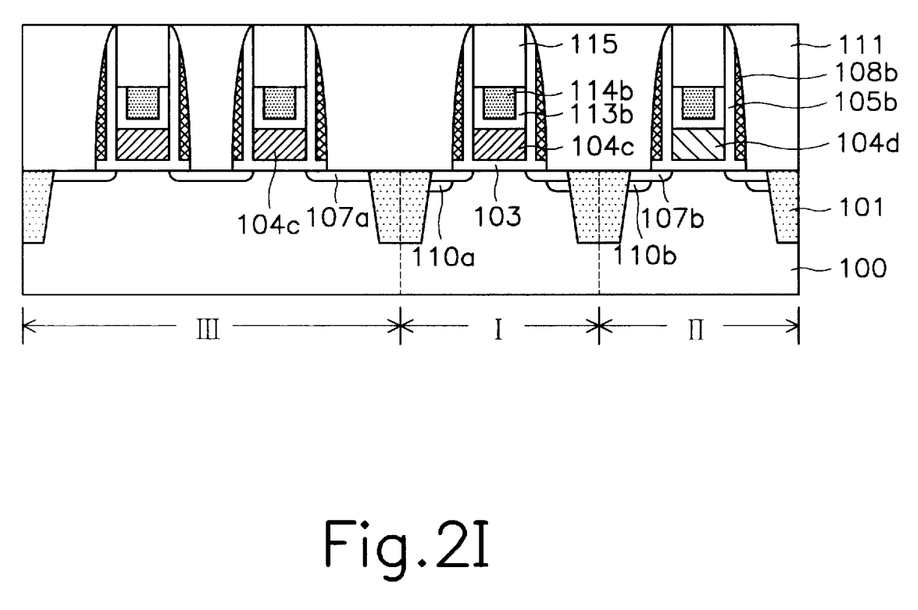

As shown in FIG. 21, the majority of metal layer 114a and the diffusion prevention 113a are removed by etching to form a metal layer pattern 114b and a diffusion prevention film pattern 113b in the lower portion of the groove and to expose the upper portion of the groove to a predetermined depth.

Afterwards, a mask insulating film is formed on the upper portion of the entire surface and then substantially removed by a CMP process. The CMP process is performed using the interlayer insulating film 111 as an etching barrier to form a mask insulating film pattern 115 which will fill the exposed upper portion of the groove.

As noted above, the method for fabricating a semiconductor device according to the present invention has various advantages.

In the process for fabricating a CMOS transistor of a high integrated semiconductor device and a cell of a DRAM, a process for forming a dual gate electrode having a layered structure of a tungsten layer and a polysilicon layer includes the steps of forming a gate electrode shape of an undoped polysilicon layer, forming an insulating film spacer at sidewalls of the polysilicon layer, forming an LDD region, removing the undoped polysilicon layer at a predetermined thickness to expose a portion where the tungsten layer will be formed, and respectively implanting different impurity ions into the undoped polysilicon layer respectively formed in the PMOS region and the NMOS region to form the tungsten layer. Thus, it is possible to prevent etching residue from occurring and also prevent the semiconductor substrate from being damaged. In addition, it is possible to prevent the tungsten layer from being oxidized due to a high temperature process such as an ion plantation process for forming the LDD region and the source/drain region, thereby improving operational characteristics of the device and process yield.

The foregoing embodiments and advantages are merely exemplary and are not to be construed as limiting the present invention. The present method can be readily applied to other types of apparatuses. The description of the present invention is intended to be illustrative, and not to limit the scope of the claims. Many alternatives, modifications and variations will be apparent to those skilled in the art. In the claims, means-plus-function clauses are intended to cover the structures described herein as performing the recited function and not only structural equivalents but also equivalent structures.

What is claimed is:

1. A method for fabricating a semiconductor device comprising the steps of:

forming a gate insulating film on a semiconductor substrate provided with a cell region and a peripheral circuit region where NMOS and PMOS regions will be formed;

forming an undoped polysilicon layer pattern of a gate electrode shape on the gate insulating film;

forming an oxide film having a predetermined thickness on an upper portion of an entire surface;

respectively forming an LDD region in the semiconductor substrate at both sides of the undoped polysilicon layer pattern of both the PMOS region in the peripheral circuit region and the NMOS regions in the cell region and the peripheral circuit region;

forming a nitride film having a predetermined thickness on the upper portion of the entire surface;

etching the nitride film and the oxide film by entire etching process to form a spacer having a double structure of a nitride film and an oxide film at sidewalls of the undoped polysilicon layer pattern;

implanting a heavy concentration of impurity ions into both spacers of the NMOS region and the PMOS region in the peripheral circuit region to form source/drain regions;

forming an interlayer insulating film on the upper portion of the entire surface and then planarizing the interlayer insulating film to expose the undoped polysilicon layer pattern;

removing a portion of the exposed undoped polysilicon layer pattern by etching to leave a predetermined thickness and to form a groove;

implanting impurity ions into the undoped polysilicon layer pattern of the NMOS and PMOS regions in the cell region and the peripheral circuit region, to form a gate electrode pattern comprising a doped polysilicon;

forming a diffusion prevention film and a metal layer in a lower portion of the groove; and forming a mask insulating film pattern in a remaining portion of the groove.

2. The method of claim 1, wherein the oxide film is formed by thermal oxidation process.

3. The method of claim 1, wherein the diffusion prevention film comprises WN.

4. The method of claim 1, wherein the metal layer is formed of a material selected from a group consisting of tungsten, TiSi$_x$ and WSi$_x$.

5. The method of claim 1, wherein the interlayer insulating film comprises an oxide film or a nitride film.

6. The method of claim 1, wherein forming the mask insulating film pattern further comprises forming a nitride film on the upper portion of the entire surface and then planarizing the nitride film by chemical mechanical polishing (CMP) using the interlayer insulating film as an etching barrier.

* * * * *